United States Patent [19]

Kumano

[11] 3,943,430

[45] Mar. 9, 1976

[54] CIRCUITRY FOR REDUCING THYRISTOR TURN-OFF TIMES

[75] Inventor: Masayoshi Kumano, Amagaski, Japan

[73] Assignee: Mitsubishi Denki Kabushi Kaisha, Tokyo, Japan

[22] Filed: June 20, 1974

[21] Appl. No.: 481,186

[52] U.S. Cl. ............ 321/45 C; 307/252 C; 307/305
[51] Int. Cl.² ...................................... H02M 3/135
[58] Field of Search ..... 321/45 R, 45 C; 307/252 B, 307/252 C, 252 M, 252 R, 305

[56] References Cited
UNITED STATES PATENTS

| | | | |
|---|---|---|---|
| 3,353,032 | 11/1967 | Morgan et al. | 307/252 B |
| 3,404,293 | 10/1968 | Harris et al. | 307/252 J |
| 3,501,650 | 3/1970 | Phoenix | 307/252 J |
| 3,544,818 | 12/1970 | Harris | 307/305 |
| 3,667,021 | 5/1972 | Anderson et al. | 321/45 C |
| 3,846,644 | 11/1974 | Takagi et al. | 307/252 J |

*Primary Examiner*—William M. Shoop
*Attorney, Agent, or Firm*—Oblon, Fisher, Spivak, McClelland & Maier

[57] ABSTRACT

A circuit for reducing thyristor turn-off time includes a thyristor connected between a power source and a load. A voltage source is connected between the anode and the cathode of the thyristor for applying across the anode and the cathode of the thyristor, upon actuation of a switch, an electrical signal sufficient to block the forward current of the thyristor. A rectifier and an impedance connected between the gate and the cathode of the thyristor cause a reverse current to flow in the gate of the thyristor upon application of the voltage source.

11 Claims, 36 Drawing Figures

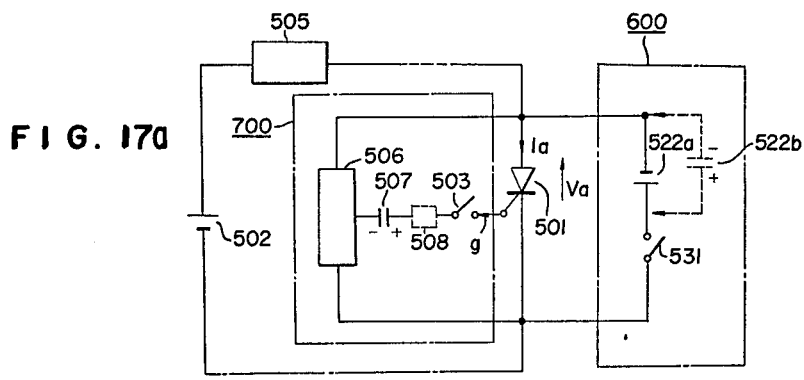
FIG. 17a
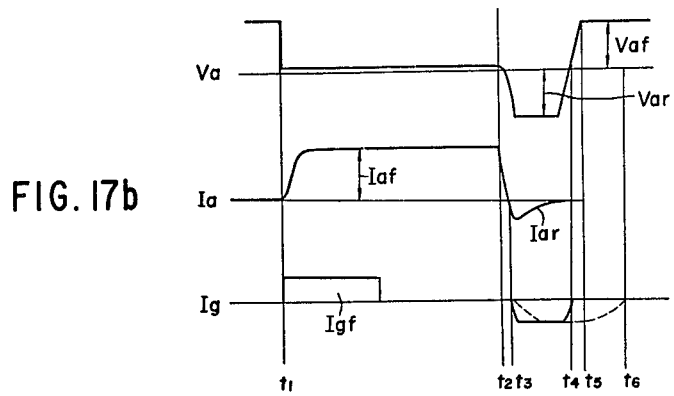
FIG. 17b
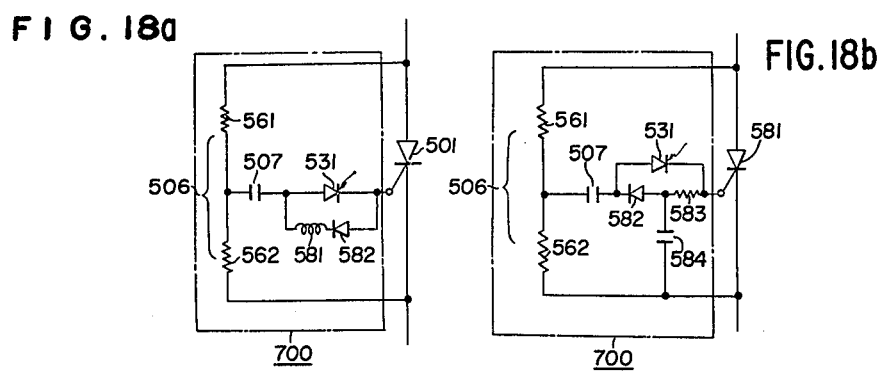
FIG. 18a
FIG. 18b
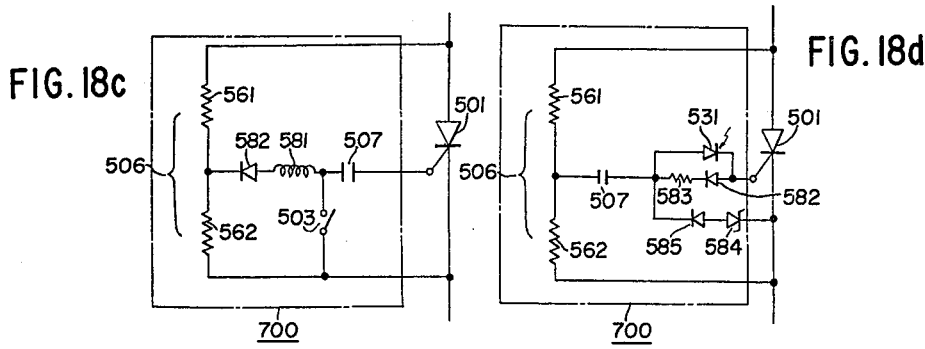
FIG. 18c
FIG. 18d

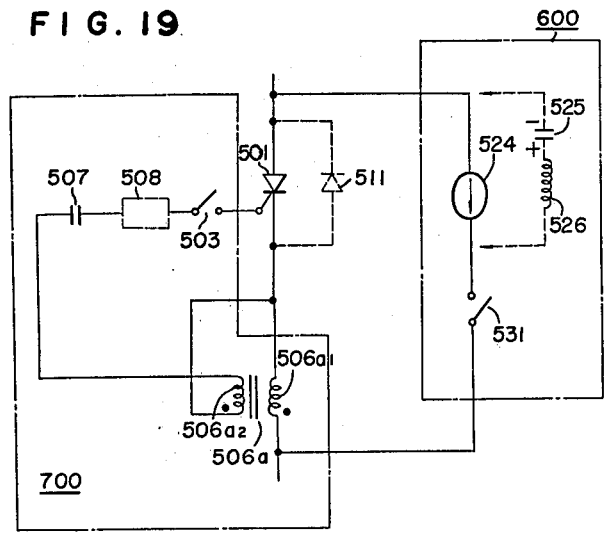

CIRCUITRY FOR REDUCING THYRISTOR TURN-OFF TIMES

BACKGROUND OF THE INVENTION

1. Field of the Invention

The present invention relates to electric power control devices of the type using thyristors, and more particularly to an electric power control device having means for improving the commutation characteristics of the thyristor. The invention therefore relates more particularly to an electric power control device in which reverse bias power, i.e., a revese voltage or current, is applied across the anode and the cathode of the thyristor to cause a reverse current to flow in the gate whereby the thyristor is turned off.

2. Description of the Prior Art

It is well known in the art that, to turn off a thyristor, a reverse voltage is applied across the anode and the cathode for a period longer than the turn-off time. To this end, a forced commutation circuit has been used in the inverter or chopper associated with the thyristor circuit. In such a circuit, the turn-off time has been rather prolonged. Nevertheless, no substantial improvements have been achieved with respect to the turn-off time characteristic, especially with thyristors used with high voltage or heavy current. This has necessitated the use of an intricate turn-off means. In addition, a considerable amount of loss has been incidental to prior art turn-off circuitry.

The gate turn off thyristor (briefly, GTO) has been known in the art. To turn off this type of thyristor, a negative current is supplied to the gate. Turn-on and turn-off can be controlled only by the gate signal. The turn-off characteristics of a GTO is such that the turn-off current gain is nor large enough in the neighborhood of the rated value and rapidly decreases with an increase in the anode current. Accordingly, with a thyristor of large capacity, a large reverse gate current is needed for turn-off. Furthermore, the turn-off characteristic cannot be improved except by the sacrifice of turn-on gain and an increase in the holding current. This has hampered the manufacture of GTO's for heavy current or high voltage applications.

A gate turn-on circuit has been used to turn on the thyristor. In such a circuit, the turn-on energy is sypplied from a turn-on power source through a control switch. Generally, the use of an isolating transformer is required because the cathode potential of the thyristor differs from the potential of the turn-on power source. If the turn-on power source is of commercial power, the size of the transformer becomes quite large, with the result that the stray capacitance and the leakage inductance increase, the rise of the turn-on pulse becomes diminished, and the potential variation on the secondary side of the transformer causes a false turn-on signal to be supplied through the stray capacitance to other thyristors. To prevent false turn-on, the prior art has been required to use a sophisticated turn-on circuit.

SUMMARY OF THE INVENTION

Therefore, an object of the invention is to provide an improved commutation means for power control devices of the type using a hybrid turn-off thyristor (hereinafter briefly, HTO) wherein, as in the usual thyristor, an external commutation circuit is provided from which a reverse bias power is applied across the anode and the cathode. This bias power is used to cause a reverse current to flow in the gate of the thyristor whereby the thyristor is turned off in a short period of time. Thus, according to the invention, the anode current is reduced by the use of the external circuit and the thyristor is turned off by the reverse gate current. For this reason, the reverse gate current may be small even if the turn-off gain is small.

Another object of the invention is to provide a power control device in which the thyristor turn-off time is reduced and the turn-off characteristic is improved.

Another object of the invention is to provide a power control device in which the thyristor used is of large capacity, yet is capable of turn-off in a short time.

Still another object of the invention is to provide a control device in which a reverse voltage or current supplied across the anode and the cathode of the thyristor is utilized to cause a reverse current to flow in the gate thereof whereby the need for the conventional reverse gate current power sourse is eliminated.

Still another object of the invention is to provide a power control device in whcih the thyristor turn-off time is reduced whereby the operation frequency characteristic is improved, the capacity of the commutation circuit is reduced, and the operating efficiency is increased.

A further object of the invention is to provide a power control device in which the reverse gate current used to turn off the thyristor is stored for use as energy to turn on the thyristor whereby the turn-off time is reduced and the turn-on means is simplified.

With these and other objects in view, the invention provides a power control devce comprising first means for supplying across the anode and the cathode of a thyristor connected between the power source and the load an electrical signal sufficient to block the forward current of the thyristor; and second means for causing a reverse current to flow in the gate of the thyristor. The first means comprises a voltage source or a current source adapted to the characteristics of the thyristor. When the thyristor is of the usual type capable of blocking the voltage in the reverse direction, the first means applies a reverse voltage across the anode and the cathode of the thyristor. The second means comprises an impedance means in series with a diode connected between the gate and the anode of the thyristor whereby the diode conducts in the direction allowing a reverse current to flow in the gate.

The second means may comprise a series circuit comprising an impedance means and an auxiliary thyristor connected between the gate and the anode of the thyristor whereby the auxiliary thyristor conducts in the direction allowing a reverse current to flow in the gate.

The thyristor may be a "reverse conducting thyristor" having a thyristor characteristic in the forward direction and a diode characteristic in the reverse direction and having voltage blocking ability. The thyristor may be connected in reverse parallel with a diode. In these instances, the first means comprises a series circuit comprising a capacitor, an impedance means and a switching means wherein the charge stored across the capacitor is released as a reverse current when the switching means makes contact. The second means comprises a diode wherein the anode is connected to the gate terminal of the thyristor and the cathode is connected to the junction between the capacitor and the impedance means. The second means may comprise a current transformer installed in the path of the reverse current provided by the first means, the transformer having its secondary winding connected between the gate and the cathode of the thyristor. When this transformer is located on the side of the cathode of the thyristor, the primary and secondary windings may not necessarily be isolated from each other, and an autotransformer may be used instead.

According to the invention, a third means may be used in addition to the first and second means. The third means comprises a series circuit having a switching means and a capacitor which is charged with the reverse current following in the gate of the thyristor. The charge stored in the capacitor is discharged through the gate of the thyristor when the switching means closes its contact. The energy thus released from the capacitor turns on the thyristor.

BRIEF DESCRIPTION OF THE DRAWINGS

A more complete appreciation of the invention and many of its attendant advantages thereof will be readily obtained as the same becomes better understood by reference to the following detailed description when considered in connection with the accompanying drawings, wherein:

FIG. 17a is a circuit diagram and FIG. 17b is a graphic diagram illustrating a device with a turn-on means according to the invention, and FIGS. 18a, 18b, 18c, 18d, 19, 20a, 20b, 20c and 20d illustrate other embodiments with turn-on means according to the invention.

DESCRIPTION OF THE PREFERRED EMBODIMENTS

Figure 1:
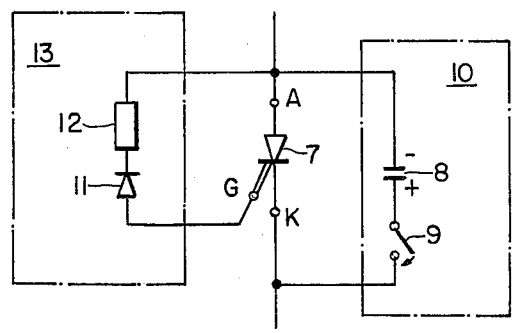
FIG. 1 is a circuit diagram showing the fundamental concept of the invention.

With reference now to FIG. 1, a basic circuit of the invention is shown wherein the reference numeral 7 denotes an ordinary thyristor (i.e., a thyristor capable of blocking voltage in the reverse direction), 8 a capacitor charged in the direction in which a reverse voltage is applied across the anode A and the cathode K of the thyristor, 10 a reverse voltage applying means comprising a semiconductor switch 9 through which the capacitor 8 is connected across A and K, and 13 a gate drive turn-off circuit connected between the anode A and the gate G comprising a series circuit of a current limiting impedance 12 and a rectifier 11 which supplies the gate terminal with a reverse current produced due to the reverse voltage from the means 10.

The thyristor 7 is turned-off in the following manner. The switch 9 is closed to cause the voltage across the capacitor 8 to be applied as a reverse voltage across A and K of the thyristor. As a result, the anode current abruptly decreases and becomes a reverse current whereby the recombination of residual carriers stored in the thyristor element occurs. At the same time, the reverse voltage is applied across A and G to cause a reverse current to flow in the gate through the rectifier 11 and impedance 12 whereby the residual carrier is displaced and the turn-off drive is accelerated.

Figure 2A:
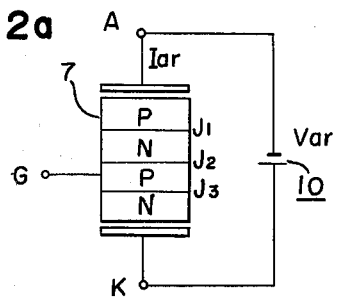
FIG. 2 is a circuit diagram useful for illustrating the principle of turn-off in the thyristor.

Principles of turn-off operation will be described by referring to FIG. 2 and to FIG. 1. The thyristor 7 is a PNPN four-layer structure having an anode electrode A, a cathode electrode K and a gate electrode G. FIG. 2a is a circuit diagram showing the state in which a reverse bias is applied at the anode. This reverse biasing serves to release the carriers in the neighborhood of junctions $J_1$ and $J_3$ resulting in a reverse current $I_{ar}$. The reverse voltage developed thereby is blocked by the two junctions $J_1$ and $J_3$. In this state, some carriers remain near the junction $J_2$. Therefore, the forward blocking function of the thyristor cannot be restored unless the recombination of these carriers takes place. However, it takes a considerable length of time to complete the recombination of carriers. It is this length of time on which the turn-off time has been largely dependent in the prior art.

Figure 2B:
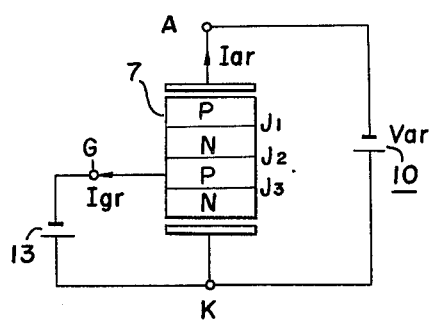

FIG. 2b is a diagram showing the state in which a reverse bias is applied at the gate and anode in parallel. The residual carriers near $J_1$ and $J_3$ are released by the reverse anode bias $V_{ar}$ and a large amount of residual carriers near $J_2$ are released by the reverse gate bias $I_{gr}$. Thus the invention enables the forward blocking function to be quickly restored.

It is noted that the reverse gate bias applied before the reverse anode current $I_{ar}$ is sufficiently small so that it can hardly serve as a reverse bias on the junction $J_2$ because in this state the reverse blocking function is not sufficiently restored in the junctions $J_1$ and $J_3$. As a result, the reverse blocking function cannot effectively be restored in the junction $J_2$. In other words, the turn-off cannot effectively be accelerated. The reverse gate biasing should therefore be made when the reverse anode current $I_{ar}$ is sufficiently reduced.

Figure 2C:
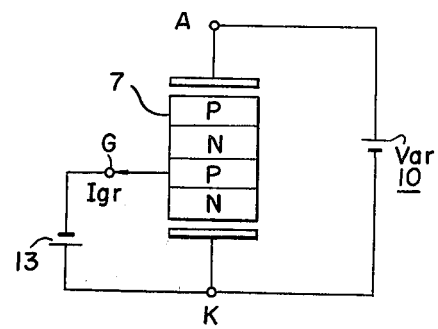

As shown in FIG. 2c, if the reverse gate bias is continued after forward voltage $V_{af}$ is applied, the reverse blocking function is not thoroughly restored in the junction $J_2$, and a reverse gate biasing current remains even in the state where the forward leakage current is larger than the normal value with the result that the amount of carriers reaching the junction $J_3$ decreases. This causes the current amplification factor to be reduced and prevents the thyristor from re-conducting in the forward direction. In the prior art thyristor which is turned off by reverse anode biasing, even after the number of carriers is sufficiently reduced, the reverse anode biasing is continued much longer than the period for which the reverse anode current is supplied in order to preclude the thyristor from re-turn-on. Whereas, according to the invention, the thyristor is reversely biased at the gate as well as at the anode whereby the re-turn-on preventive time is remarkably reduced. Because the invention allows most carriers to be released at the anode, the reverse gate biasing current can be quite reduced unlike the gate turn-off type thyristor which depends solely on the gate for the control of its turn-off.

Figure 3:
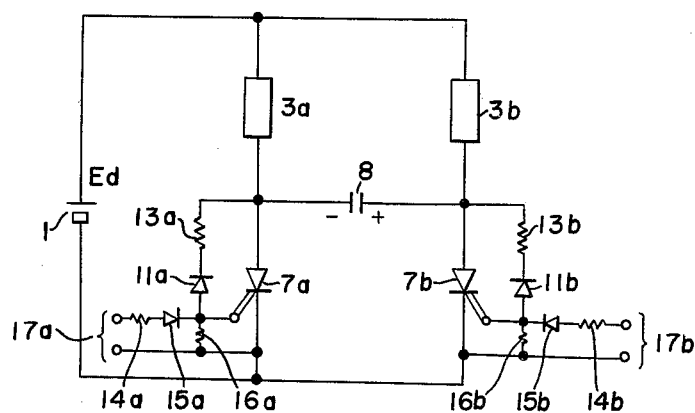
FIG. 3 is a circuit diagram showing a bistable multivibrator used according to the invention.

Referring to FIG. 3, there is shown a bistable multivibrator circuit according to the invention wherein the numeral 1 denotes a DC power source with voltage Ed, 3a and 3b loads, 7a and 7b thyristors, 8 a commutation capacitor, 11a and 11b diodes, 13a, 13b, 14a and 14b resistors, and 15a and 15b diodes. A circuit for driving reverse current for the turn-off gate comprises a series circuit of diodes 11a and 11b and resistors 13a and 13b. A circuit driving forward current for the turn-on gate comprises resistors 14a and 14b and diodes 15a and 15b. The reference numerals 16a and 16b represent resistors for limiting the reverse gate voltage. These resistors are installed only when needed.

When a turn-on voltage pulse is applied to the terminal 17a, a forward current flows in the gate of the thyristor 7a, and this thyristor is turned on. At the same time, a DC voltage Ed is applied across the load 3a. A circuit formed of DC power source 1, load 3b, capacitor 8, and thyristor 7a permits the capacitor to be charged to the potential Ed at a polarity indicated in FIG. 3. Then, when a turn-on pulse is applied to the terminal 17b, the thyristor 7b is turned on and the voltage from the capacitor 8 is applied reversely across the anode and the cathode of thyristor 7a to turn off this thyristor. Since, as shown, the thyristor 7a has its gate connected to its anode through the diode 11a and resistor 13a, and to its cathode through the resistor 16a, the reverse voltage across the anode and the cathode is divided by the proportion of resistance 13a to 16a. Therefore this reverse voltage serves to reversely bias the gate and the cathode to cause a reverse current to flow in the gate thereby accelerating the turn-off drive. In this state, the capacitor 8 continues to discharge until its potential reaches Ed. This is a half cycle of operation.

Figure 4A:
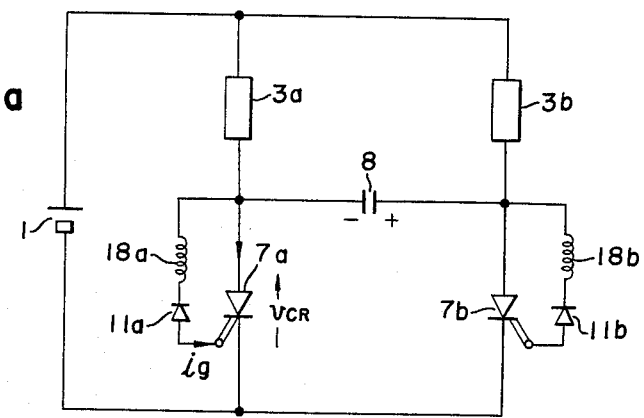
FIG. 4a is a circuit diagram and FIG. 4b is a graphic diagram showing another bistable multivibrator used according to the invention.
Figure 4B:
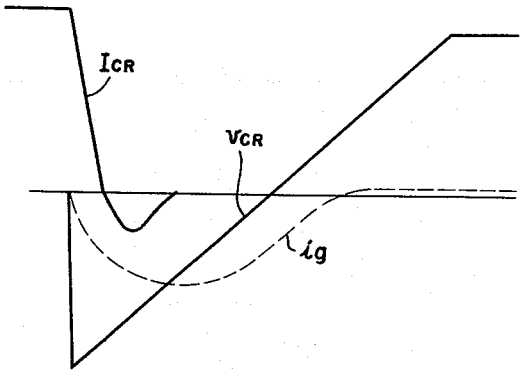

FIG. 4 shows another bistable multivibrator circuit according to the invention. FIG. 4a is a circuit diagram and 4b a waveform diagram. This embodiment is similar to the one shown in FIG. 3 except that reactors 18a and 18b are used instead of the resistor 13. Thus, unlike the circuit of FIG. 3 wherein the reverse gate current flows only for the period during which the thyristor is reversely biased, in the embodiment shown in FIG. 4 the reverse gate current $i_g$ flows longer than the reverse voltage $V_{CR}$, and the peak of $i_g$ is delayed and brought near zero thyristor current where the gate turn-off effect is greatest. Accordingly, the capacity of the capacitor 8 can be reduced.

Figure 5:
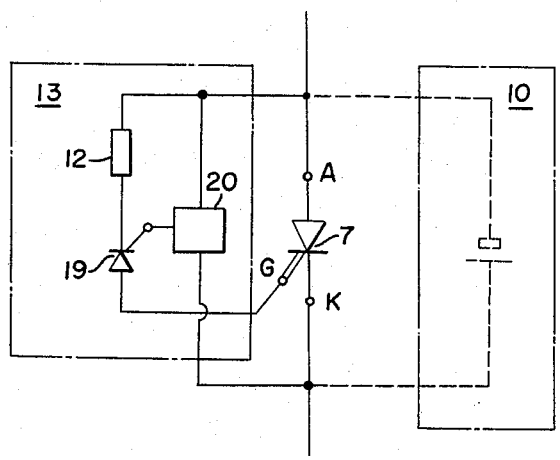
FIG. 5 is a circuit diagram showing another example of a fundamental arrangement of the invention.
Figure 13:
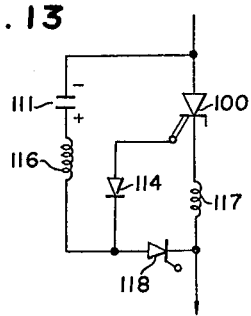
FIGS. 13 and 14 are circuit diagrams showing modifications derived from the arrangement of FIG. 12.

Referring to FIG. 5, there is shown a basic circuit arrangement embodying the invention wherein the numeral 7 denotes a thyristor, 10 a reverse voltage applying means as in FIG. 1, and 13 a turn-off gate circuit for supplying a reverse current to the gate. The circuit 13 comprises an auxiliary thyristor 19 (which corresponds to the rectifier shown in FIG. 1) and a delay circuit 20 which generates a pulse with a delay of a given time with respect to the reverse voltage (i.e., the turn-on signal) applied across A and K of the thyristor 7. Thus the timing for the reverse current to flow in the gate can be determined to be near the anode current of the thyristor 7 by suitably adjusting the delay time of the pulse applied to the gate of the auxiliary thyristor 7. Because of this feature, the turn-off efficiency can be maximized.

Figure 6:
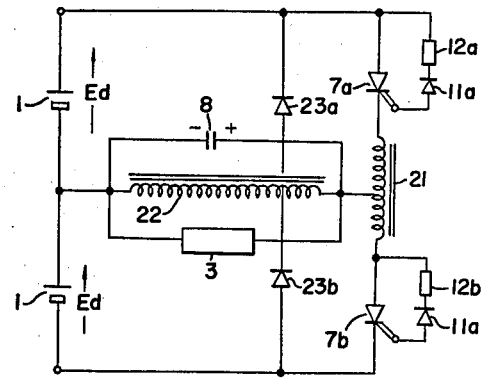
FIGS. 6 to 8 are circuit diagrams showing inverter circuits used according to the invention.
Figure 7:
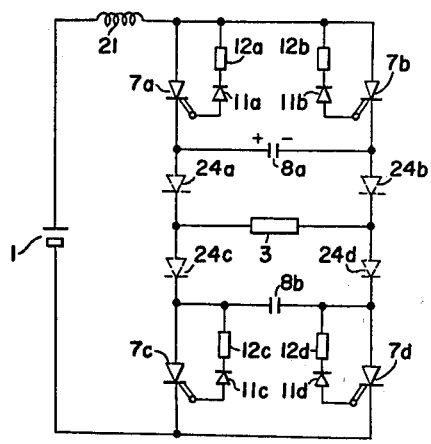
Figure 8:
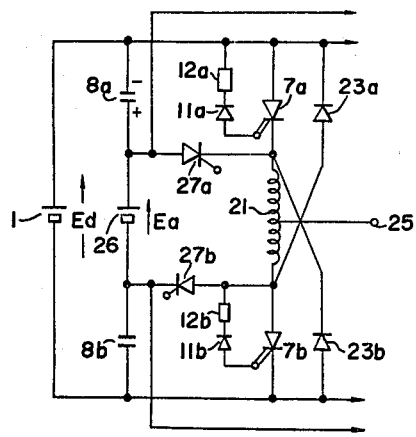

FIGS. 6 to 8 illustrate inverter circuits to which the invention is applied.

Referring to FIG. 6, there is shown a known inverter called a McMurrey-Bedford inverter which is capable of generating an AC output through thyristors 7a and 7b which are alternately driven from a DC power source 1. The inverter comprises a commutation capacitor 8, a commutation reactor 21, an output transformer 22, and feedback diodes 23a and 23b.

This inverter is operated in the following manner. Assume that the thyristor 7a is turned off and the thyristor 7b is turned on. The capacitor 8 is charged to about Ed at the polarity indicated immediately before commutation. When the thyristor 7b is turned on, a voltage of about 4 Ed is developed across the commutation reactor 21. As a result, a reverse voltage about 2 Ed is applied across A and K of the thyristor 7a whereby a reverse current flows in the gate through the rectifier 11a and impedance 12a, as in the previous embodiment, to cause this thyristor to be quickly turned off.

FIG. 7 is a circuit diagram of a known parallel inverter wherein, by turning on the thyristor 7b, a revese voltage is applied from the commutation capacitor 8a across A and K of the thyristor 7a. As a result, a reverse current flows in the gate of the thyristor 7a so that this thyristor is quickly turned off. The purpose of diodes 24a, b, c and d is to prevent the capacitors 8a and b from releasing their charge through a load 3. This capacitor is not needed for the sinusoidal output inverter (high frequency inverter) or the like.

In the foregoing examples where the invention is applied to inverters, an auxiliary thyristor of opposite phase is used as a switching means for applying a reverse voltage. The example shown in FIG. 8 uses a thyristor only for commutation. When power is supplied from a DC power source 1 to an output terminal 25 through a thyristor 7a, a commutation capacitor 8a is charged to about voltage Ea at a polarity shown in FIG. 8 by auxiliary power source 26. Under this condition, when commutation thyristor 27a is turned on, a discharge loop is formed comprising commutation reactor 21 and diode 23a, and a reverse voltage is applied from the capacitor 8a across A and K of the thyristor 7a whereby a reverse current flows in the gate of this thyristor.

As described above, the invention is readily applicable to prior art choppers and inverters using thyristors for which commutation is achieved by the use of a reverse voltage. According to the invention, the commutation characteristics regarding turn-off speed can be improved. Thus the switching circuit including the commutation circuit can be constructed to be small in size, light in weight, yet large in capacity. Furthermore, the frequency characteristic for the switching operation can be improved which is conducive to improvements on the device as a whole with respect to operating characteristics, size and weight reduction.

The foregoing description relates to thyristors of the type capable of blocking voltage in the reverse direction. Besides this thyristor, a reverse conducting thyristor as shown in FIG. 9 may be used in accordance with the invention. The reverse conducting thyristor exhibits a diode characteristic where voltage is not blocked in the reverse direction. A diode may be used in reverse parallel relationship with an ordinary thyristor to function as a reverse conducting thyristor. The invention can enhance the usefulness of this type of thyristor (hereinafter referred to as HTO, including the reverse parallel thyristor-diode circuit). Application examples of this type of thyristor are described below.

Figure 9A:
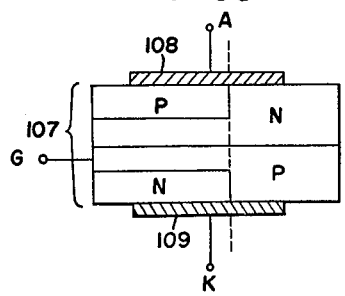
FIG. 9a is a sectional diagram and FIG. 9b is a graphic diagram illustrating a reversely conducting thyristor used in accordance with the invention.
Figure 9B:
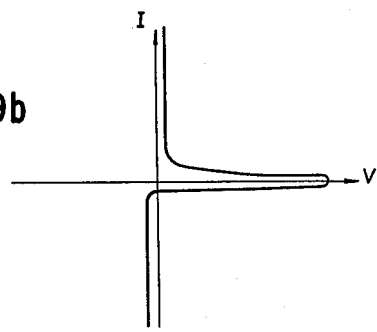

With reference to FIG. 9a, the structure of a hybrid turn-off HTO is illustrated wherein the numeral 107 denotes a base layer comprising four layers (PNPN) partly including two layers (NP) 108 and 109 which represent anode and cathode electrodes connected to terminals A and K. The P base layer is connected to gate terminal G. In FIG. 9a, the structure on the left half is of a thyristor and that on the right half is that of a diode. This multi-layer element exhibits a thyristor characteristic in the forward direction, a diode characteristic in the reverse direction, and has no voltage blocking function.

Figure 10:
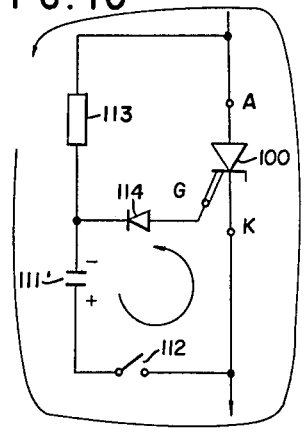
FIG. 10 is a circuit diagram showing a basic arrangement in which the thyristor of FIG. 9 is used.

FIG. 10 is a circuit diagram showing a basic arrangement using a HTO according to the invention wherein the numeral 100 denotes the HTO. The capacitor 111 and a semiconductor switch 112 are serially connected between A and K of the thyristor HTO. The capacitor 111 is charged in the direction allowing a reverse current to flow across A and K. One end of the series circuit of capacitor 111 and switch 112 is connected to K and the other end to A through an impedance 113 and also to gate G through rectifier 114 installed in the direction allowing a reverse current to flow in the gate.

The thyristor is turned off in the following manner. The switch 112 is closed whereby a closed loop is formed of capacitor 111, switch 112, HTO 100, and impedance 113. As a result, the capacitor discharges to cause a reverse current to flow across A and K. This gives rise to a voltage drop thereby reversely biasing HTO to turn off HTO. At the same time, another closed loop is formed of capacitor 111, switch 112, HTO 100, and rectifier 114. Through this loop, part of the reverse current flows as a reverse gate current which serves to displace the residual carriers stored in the base layer of HTO and to expedite the turn-off action.

Figure 11:
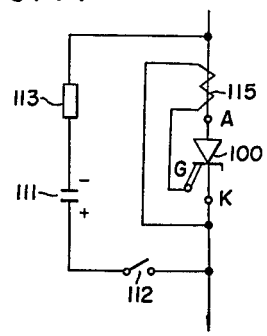
FIGS. 11 and 12 are circuit diagrams showing other basic arrangements of the invention.

FIG. 11 shows another fundamental arrangement according to the invention wherein the numeral 115 represents a current transformer having its primary winding connected to the anode A of HTO 100 and its secondary winding to the gate G thereof.

The thyristor is turned off in the following manner. The switch 112 is closed whereby a closed loop is formed of capacitor 111, switch 112, HTO 100 and primary winding impedance 113 of CT 115. Through this loop, the charge stored in the capacitor is discharged. The discharge current flows as a reverse current across A and K of HTO whereby HTO undergoes turn-off. At the same time, a current induced in the secondary winding of the current transformer as a reverse current in the gate of HTO 100 accelerates the turn-off action.

Figure 12:
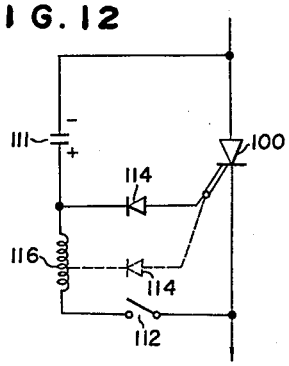

FIG. 12 illustrates another fundamental arrangement according to the invention wherein the numeral 116 denotes a reactor operated as the impedance shown in FIGS. 10 and 11. The numeral 111 denotes a capacitor similar to the one shown in FIG. 10 but located in a different position.

A switch 112 is closed to turn off HTO 100 whereby a closed loop is formed of capacitor 111, reactor 116, switch 112, and HTO 100. A voltage is applied from the capacitor to the reactor 116, and, at the same time, the capacitor discharges. The discharge current flows as a reverse current in HTO causing turn-off. While the capacitor continues to discharge and when the voltage polarity of the capacitor becomes inverted, the voltage of the reactor is inverted. Consequently, the rectifier 114 conducts and the reverse anode current is switched to flow as a reverse current in the gate. Thus the turn-off action is accelerated.

An intermediate tap may be installed as shown by the broken line through which the reactor is connected to the rectifier 114. By this arrangement, the value of the reverse gate current can be adjusted.

FIG. 13 shows another example derived from the embodiment shown in FIG. 12. In FIG. 13, a reactor 116 is divided into two parts a part of which, as indicated by the numeral 117, is operated as a turn-on di/dt control reactor in series with HTO in the load current path. A thyristor 118 is used in place of the switch 112. This circuit operates in the same manner as the one shown in FIG. 12 for commutation.

Figure 14:
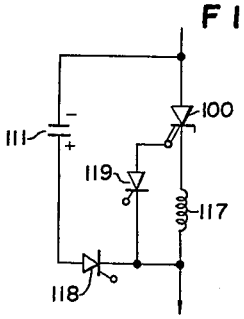

FIG. 14 is also a modification of the embodiment shown in FIG. 12. In this example, the reactor 116 is omitted and a thyristor 119 is used in place of the rectifier 114. The commutation thyristor 118 is not included in the loop of reverse gate current. With this arrangement, the relationship between the commutation current (i.e., the discharge current from the capacitor) and the timing in the beginning of the flow of the reverse gate current can be adjusted to be most efficient for commuation.

Figures 15A, 15B:
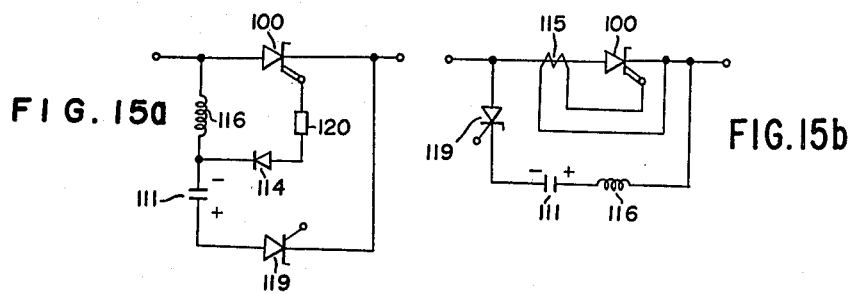
FIG. 15 is a circuit diagram showing a DC chopper circuit in accordance with the invention.

FIG. 15 shows examples of DC chopper circuits according to the invention. FIG. 15a shows a circuit using the basic circuit shown in FIG. 10. In FIG. 15a, the numeral 100 denotes a thyristor HTO operated as the main switch of the chopper, 119 denotes a reverse conducting thyristor wherein turn-off acceleration is not dependent on reverse gate current. This thyristor is used as a commutation switch for HTO 100. The numeral 120 denotes an impedance installed when necessary to control the value of the reverse gate current.

When the reverse conducting thyristor is turned on to turn off the chopper, a commutation closed-loop is formed of capacitor 111, thyristor 119, HTO 100, and reactor 116 whereby the capacitor discharges to cause HTO 100 to be turned off in the same manner as illustrated in FIG. 10. At the end of the turn-off cycle, the capacitor 111 is charged to a polarity opposite to the one shown in FIG. 15a. Then, when HTO 100 is turned on to turn on the chopper, a loop is formed in the direction opposite to the first loop whereby the voltage across the capacitor 111 is inverted to a polarity shown in the figure to be ready for the next commutation.

FIG. 15b is another example illustrating the basic circuit of FIG. 11. This circuit is operated in the same manner as illustrated in FIGS. 11 and 15a.

Figures 15C, 15D:
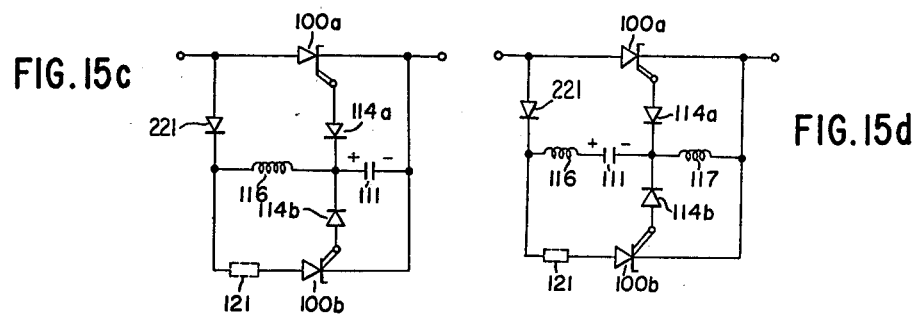

FIG. 15c is another example based on the basic circuit of FIG. 10. The function of this circuit as a chopper circuit is different from that of FIGS. 15a or b. In FIG. 15c, the reference 100a denotes a thyristor HTO operated as the main switch, 100b a thyristor as an auxiliary switch for commutation with respect to the thyristor 100a, 221 a reverse current blocking rectifier.

When HTO 100b is turned on to turn off the chopper, a loop is formed of capacitor 111, reactor 116 and HTO 100b. The capacitor, charged at a polarity indicated in the figure, discharges causing the voltage across the capacitor to be inverted. As the capacitor continues to discharge, the current becomes inverted. In this state, another loop is formed of capacitor 111, HTO 100a, rectifier 221 and reactor 116. As a result, the capacitor charging current is shunted to the two loops to cause the two thyristors 100a and 100b to be turned off, and a reverse current flows in the gates thereof whereby turn-off is accelerated. The numeral 121 indicates an impedance installed when necessary to balance the currents flowing in the two loops during commutation.

FIG. 15d is another example according to the basic circuit shown in FIG. 12. This chopper is similar to that shown in FIG. 15c and hence the description of its operation is omitted.

Referring to FIG. 16, examples of monophase inverter circuits are illustrated in connection with the invention.

Figures 16A, 16B:
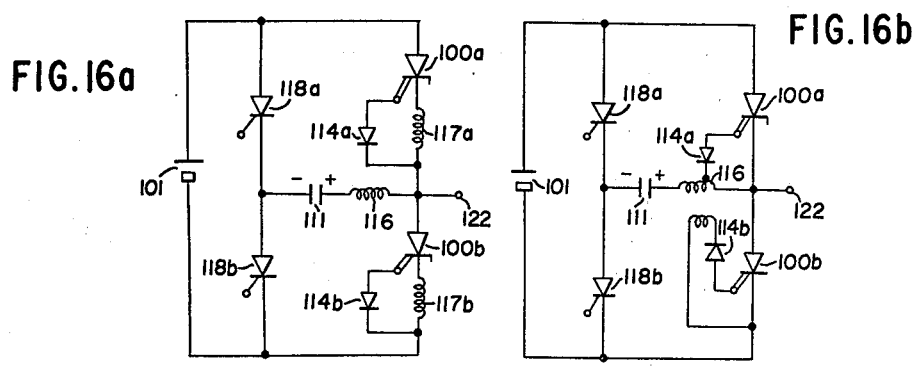
FIG. 16 is a circuit diagram showing an inverter circuit in accordance with the invention.

FIG. 16a shows an inverter circuit using the basic circuit shown in FIG. 12. This example is such that two HTO's 100a and 100b are turned on and off alternately so that AC power is obtained at output terminal 122 from DC power source 101.

Assume that HTO 100a is conducting. When the commutation thyristor 118a is turned on to turn off HTO 100a, a closed loop is formed of capacitor 111, reactors 116 and 117a, HTO 100a, and thyristor 118a. As a consequence, the capacitor discharges its stored charge current to cause HTO 100a to be reversely biased. In this state, HTO 100a becomes turned off. When the capacitor current begins to decrease with the result that the voltage across the capacitor is inverted, a reverse current flows in the gate of HTO 100a by the function of reactor 117a thereby accelerating the turn-off action. When HTO 100b is turned on after the thyristor 118a has completed its turn-off, the output terminal 122 stands at a negative potential, and the capacitor is charged at a polarity opposite to the one shown in the figure and thus is made ready for the next half cycle of operation.

FIG. 16b shows another example of the basic circuit of FIG. 12 for the commutation of HTO 100a, and the basic circuit of FIG. 11 for the commutation of HTO 100b. A tap is provided on the primary winding of commutation reactor 116, and the secondary winding is isolated from the primary winding, to make this reactor operate as a current transformer. The operation of the inverter is the same as that shown in FIG. 16a and hence the description thereof is omitted.

Figure 16C:
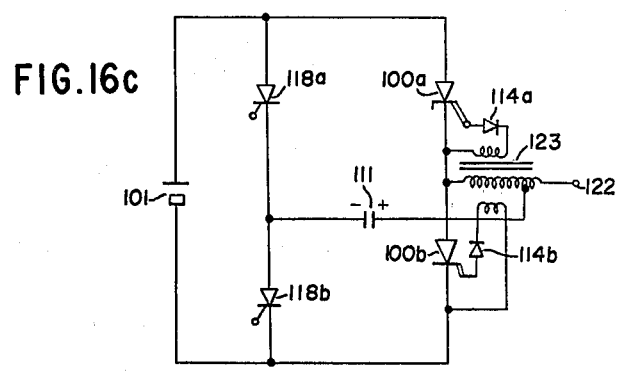

FIG. 16c shows another example wherein a commutation current transformer 122 is used instead of the foregoing commutation reactor 116, and the discharge current from the commutation capacitor 111 is controlled according to the value of the load current whereby the charge stored in the commutation capacitor is effectively used. At the same time, the capacity of the commutation capacitor can be reduced. The commutation tranformer is provided with secondary and tertiary windings through which a reverse current is supplied to the gates of the HTO's.

As has been described in detail, the invention can be effectively applied to power control devices using reverse conducting thyristors or ordinary thyristors connected with diodes in reverse parallel relationship which have no voltage blocking function in the reverse direction. In this application, the invention enables commutation characteristics (or turn-off speed) to be much improved. This leads to improvements of switching circuits of power control devices including commutation circuits with respect to size, weight reduction, increase in capacity and frequency of switching operation. It is evident that these features make it feasible to improve the characteristics of the device as a whole, as well as to reduce the size and weight thereof.

Other useful features of the invention are described below by way of example in relation to a power control device in which a thyristor, when turned off, is reversely biased across the anode and the cathode. The reverse bias power is utilized to effect a reverse bias on the gate. The energy of reverse gate biasing power is stored for use during the subsequent turn-on and thus both turn-off and turn-on characteristics are improved.

Referring to FIG. 17a, the numeral 501 denotes a thyristor, 502 a power source, 505 a load, 600 an anode reversely biasing device comprising an anode reversely biasing switch 531 and an anode reversely biasing power source 522a. The numeral 700 represents a gate circuit comprising a voltage divider 506 for dividing the voltage between the anode and the cathode of thyristor 501, a capacitor 507, a gate control switch 503, and a delay device 508 installed if necessary. The gate reversely biasing power source 522a may be replaced with an anode reversely biasing capacitor 522b as indicated by the broken line.

The operation of this circuit will be described by referring to FIG. 17b. The control switch 503 is closed at timing $t_1$ to cause a forward gate current Igf to flow. By this operation, the thyristor 501 is turned on and the anode current Iaf flows. The anode voltage Va is only a forward voltage drop.

To turn off the thyristor 501, the switch 531 is closed, and reverse anode biasing voltage Var is applied from the device 600 for the period from $t_2$ to $t_4$. At timing $t_5$, the thyristor voltage Va reaches nearly the normal forward voltage Vaf. The period from $t_4$ to $t_5$ is one during which the excess re-rise forward voltage is raised. The period from $t_2$ to $t_4$ is for reversely biasing the anode.

While the anode is reversely biased, the current Ia of the thyristor 501 becomes reverse current Iar at timing $t_2$ and the stored carriers are released. At the same time, the reverse anode bias is applied to the voltage divider 506 of the gate circuit 700. The gate is reversely biased by the divided voltage to cause a reverse gate bias current to flow. As a result of the reverse gate current, the gate capacitor 507 is charged to be ready for the subsequent turn-on. When the stored carriers are nearly completely released and the reverse current Iar vanishes, the anode reverse biasing is terminated to restore the forward voltage of the thyristor.

To enhance the effect of the invention, the delay device 508 (e.g., a reactor) is provided in the gate circuit 700 as shown in FIG. 17a. Thus, even in the process where the anode reverse biasing is terminated at timing $t_4$ to restore the forward voltage, it is feasible to maintain gate reverse biasing till $t_6$ as indicated by the broken line in FIG. 17b. In other words, the gate can be effectively subjected to reverse biasing thereby minimizing the time needed to turn off the thyristor.

The effect which the invention has on turn-off has been described hereinbefore. Another noteworthy feature of the invention is that the reverse bias used to bring about effective turn-off is utilized to provide energy for turn-on as described below.

In FIG. 17a, the reverse bias applied when the thyristor is turned off serves to reversely bias the gate. The resultant reverse bias current Igr causes the gate capacitor 507 to be charged to a polarity indicated in the figure. The capacitor holds this charge.

Then, assume that a forward voltage is applied to the anode of the thyristor to turn on the thyristor. The control switch 508 is closed whereby a closed loop is formed of capacitor 507, thyristor 501 through gate and cathode, and voltage divider 506. The voltage across the capacitor and part of the thyristor forward voltage (i.e., a divided voltage from the voltage divider) are applied to the gate whereby the thyristor is turned on. Even if the voltage between the anode and the cathode of the thyristor is reduced to the value of the forward voltage drop, sufficient gate current can be supplied from the capacitor, and thus a more stable turn-on can be realized. Furthermore the invention dispenses with the need for a gate-insulated transformer thereby reducing the possibility of misturn-on.

FIG. 18 schematically illustrates other embodiments of the invention. In these examples, only thyristor 501 and gate circuit 700 are shown and other associating circuits such as anode reversely biasing device 600 are not shown.

FIG. 18a shows an example wherein a light switch 531 such as a light diode and a light thyristor is used as the control switch 503, a series circuit of resistors 561 and 562 is used as the voltage divider 506, and a reactor 581 and a series diode 582 are connected in reverse-parallel relationship with the light switch 531 for use as a delay device which delays the gate reverse biasing current with respect to the anode reverse biasing voltage for turn-off. In this curcuit, the rise of the reverse gate bias current is delayed with respect to the reverse anode bias voltage by the function of reactor 581 with the result that the reverse gate bias current is sustained for a predetermined duration even after forward anode biasing is restored. Thus the thyristor can be efficiently turned off as in the previous embodiments. Because a light switch is used for turn-on control, the thyristor circuit can readily be isolated from a high voltage circuit.

FIG. 18b is an example wherein a resistor 583 and a capacitor 584 are used in place of the foregoing reactor for the delay device. This circuit is as usefull as the one shown in FIG. 18a.

FIG. 18c is another example wherein the control switch 503 is used in a different place. This circuit operates like the one shown in FIGS. 18a and 18b.

FIG. 18d is another example wherein a nonlinear element comprising a zener diode 584 and a diode 585 is disposed between the gate and the cathode. Thus, a reverse bias voltage is established at the gate during reverse anode biasing to maintain stable reverse gate biasing.

In the above examples, a reverse voltage is used to reversely bias the anode. A reverse current may be used instead of the reverse voltage in the following manner.

Referring to FIG. 19, there is shown a circuit diagram of another embodiment of the invention wherein a current source 524 is used in place of the voltage source 522a of the anode reversely biasing means 600, and a current transformer (shunt) 506a is used in place of the voltage divider 506 of the gate circuit 700 as in FIG. 17a.

In FIG. 19, when the anode reversely biasing switch 531 is closed, a closed loop is formed of current source 524, the primary winding $506a_1$ of current transformer 506a, and diode 511 connected in reverse-parallel with the thyrister 501. The thyristor 501 is reversely biased by the forward voltage drop across the diode 511. At this moment, another closed loop is formed of the secondary winding $506a_2$ of current transformer 506a, the gate of thyristor 501, and capacitor 507 whereby a reverse bias current flow in the gate. By this current, the capacitor 507 is charged to be ready to supply the subsequent turn-on energy. In other words, reverse anode biasing in parallel with reverse gate biasing can assure stable turn-off drive and provide turn-on energy at the same time. The purpose of the delay element 508 is to delay the reverse gate bias a predetermined time with respect to the reverse anode bias as in the foregoing examples. According to the invention, an anode reversely biasing capacitor 525 may be used in place of the current source 524, or instead, a series circuit of a capacitor and an impedance 526 may be used. A reverse conducting thyristor may be used in place of the thyristor 501. In such a case, the use of diode 511 can be eliminated.

FIGS. 20a through 20d are diagrams showing gate circuits according to the invention. In these circuits, the anode reversely biasing device 600 is not shown.

Referring to FIG. 20a, a current transformer 566 is installed on the side of the anode of the thyristor 501. When the diode 511 conducts and the thyristor 501 is reversely biased at the anode, a current is induced in the secondary winding of current transformer 566. This current passes through the anode and gate of the thyristor 501 and diode 582 and charges the capacitor 507 to a polarity indicated in FIG. 20a. At the same time, the gate is reversely biased. When the light switch 531 is turned on, the charge stored in the capacitor 507 is supplied to the gate of the thyristor 501 through the light switch 531 to cause the thyristor to be turned on. In the figure, the numeral 586 denotes a dummy load on the current transformer.

FIG. 20b shows another example wherein a current transformer CT is installed on the cathode side of thyristor 501. In this arrangement, the transformer may be an autotransformer, instead of one having primary and secondary windings. If necessary, a zener diode 587 may be used in parallel with the capacitor 507 whereby the capacitor can be prevented from being overcharged and a sufficient period can be secured for reverse gate biasing. The impedance 588 us installed, if necessary, to be used for the intial turn-on.

FIG. 20c shows another example wherein a current transformer 506b is installed only in the path of reverse biasing diode 511 and a reactor 583 is used as the delay element. A nonlinear element 584 and a diode 585 are installed, if necessary, for use as means for protecting the gate against reverse voltage.

FIG. 20d shows another example wherein a delay circuit comprising a capacitor 584 and a resistor 583 is used as the gate delay device which operates like the one shown in FIG. 8b.

In the above examples, a commutation circuit associated with the prior art chopper or inverter may be used instead of the anode reversely biasing means. The invention is applicable not only to forced commutation circuits such as choppers and inverters but also to rectifier circuits such as power commutation circuits.

In the above examples, the gate circuit is described as a circuit comprising discrete circuit elements. Part or all of these constitutent elements, plus thyristor elements, may be integrated since, according to the invention, the energy needed for turn-on, as well as the reverse gate biasing energy for turn-off is small.

Thus, according to the invention, as has been described above, the thyristor is reversely biased at the anode in order to turn off the thyristor and, at the same time, a reverse bias is applied to the gate at a given timing and for a given period of time whereby the turn-off time is markedly reduced and the turn-off means is simplified. Furthermore, reverse gate biasing is effected by the reverse anode biasing power (either current of voltage), thereby simplifying the gate reversely biasing means. The reverse biasing energy is stored to be used for the subsequent turn-on drive, which makes it possible to simplify the turn-on circuit.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A circuit comprising:
   a thyristor connected between a power source and a load having the function of blocking voltage in the reverse direction;
   first means connected between the anode and the cathode of the thyristor for applying a reverse voltage to the thyristor;
   second means connected between the gate and the anode of the thyristor for causing a reverse current flow in the gate of the thyristor by the reverse voltage provided by said first means;
   said second means comprising a series circuit of an impedance means and an auxiliary thyristor connected between the gate and the anode of the thyristor, the auxiliary thyristor having a diode characteristic in the reverse direction and being operable in the direction allowing a reverse current to flow in the gate of the thyristor.

2. A circuit comprising:
   a thyristor connected between a power source and a load;
   first means connected between the anode and the cathode of the thyristor for applying across the anode and the cathode of the thyristor an electrical signal sufficient to block the forward current of the thyristor;
   second means for causing a reverse current to flow in the gate of the thyristor by the electrical signal provided by the first means;
   third means comprising a series circuit connected between the gate and cathode of the thyristor having at least a switching means and a capacitor charged with the reverse current flowing in the gate of the thyristor wherein when the switching means is closed, the charge stored in the capacitor is discharged through the gate of the thyristor and the thyristor is turned on by the discharge from the capacitor.

3. A circuit comprising:
   a thyristor connected between a power source and a load having the function of blocking voltage in the reverse direction;
   first means connected between the anode and the cathode of the thyristor for applying a reverse voltage to the thyristor;
   second means connected between the gate and the anode of the thyristor for causing a reverse current to flow in the gate of the thyristor by the reverse voltage provided by said first means;
   third means comprising a series circuit connected between the gate and cathode of the thyristor having at least a switching means and a capacitor charged with the reverse current flowing in the gate of the thyristor wherein the charge stored in the capacitor is discharged through the gate of the thyristor and the thyristor is turned on by the discharge from the capacitor.

4. An electric power control device as claimed in claim 3 wherein the switching means is a light switch.

5. A circuit comprising:
   a thyristor connected between a power source and a load having the function of blocking voltage in the reverse direction;
   first means connected between the anode and the cathode of the thyristor for applying a reverse voltage to the thyristor;
   second means connected between the gate and the anode of the thyristor for causing a reverse current to flow in the gate of the thyristor by the reverse voltage provided by said first means;
   said second means comprising a series circuit of an impedance means and a diode connected between the gate and the anode of the thyristor, the diode being operated in either direction allowing a reverse current to flow in the gate of the thyristor;
   a capacitor connected in series with the diode and charged with the reverse current flowing in the gate of the thyristor;
   a switching means connected in series with the capacitor and in parallel with the diode and being capable of causing the capacitor to be discharged through the gate of the thyristor and allowing the thyristor to be turned on by the discharge from the capacitor.

6. A circuit comprising:
   a thyristor connected between a power source and a load, having a thyristor characteristic in the forward direction, a diode characteristic in the reverse direction and having no other voltage blocking function;
   first means disposed between the cathode and anode of the thyristor comprising a series circuit having at least a reverse biased capacitor, an impedance means and a switching means and being capable of causing the reverse charge stored in the capacitor to be immediately released as a reverse current to the thyristor when the switching means is closed; and
   second means connected between the gate and anode of the thyristor for shunting part of said reverse current to the gate of the thyristor.

7. A circuit as claimed in claim 6 wherein the switching means is a light switch.

8. An electric power control device as claimed in claim 6 wherein said second means comprises a diode having it anode connected to the gate terminal of the thyristor and its cathode connected to the junction between the capacitor and the impedance means.

9. An electric power control device as claimed in claim 6 wherein said second means comprises a current transformer installed in the path of the reverse current provided by said first means and having its secondary winding connected between the gate and the cathode of the thyristor.

10. An electric power control device as claimed in claim 9 wherein the current transformer is installed in the reverse current path on the side of the cathode of the thyristor.

11. An electric power control device as claimed in claim 9 further comprising: a capacitor connected into the secondary winding circuit of the current transformer and charged with the reverse current flowing in the gate of the thyristor; and a switching means connected in series with the capacitor and being capable of causing the capacitor to be discharged through the gate of the thyristor and allowing the thyristor to be turned on by the discharge from the capacitor.

* * * * *